United States Patent
Noguchi et al.

(10) Patent No.: US 11,935,610 B2
(45) Date of Patent: Mar. 19, 2024

(54) DYNAMIC ERROR MONITOR AND REPAIR

(71) Applicant: Taiwan Semiconductor Manufacturing Company, Ltd., Hsinchu (TW)

(72) Inventors: Hiroki Noguchi, Hsinchu (TW); Ku-Feng Lin, New Taipei (TW); Yih Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 17/856,756

(22) Filed: Jul. 1, 2022

(65) Prior Publication Data

US 2022/0336037 A1    Oct. 20, 2022

Related U.S. Application Data

(63) Continuation of application No. 17/130,250, filed on Dec. 22, 2020, now Pat. No. 11,380,415.

(60) Provisional application No. 62/982,369, filed on Feb. 27, 2020.

(51) Int. Cl.
*G11C 29/20* (2006.01)
*G11C 29/24* (2006.01)
*G11C 29/42* (2006.01)
*G11C 29/44* (2006.01)

(52) U.S. Cl.
CPC ............. *G11C 29/42* (2013.01); *G11C 29/20* (2013.01); *G11C 29/24* (2013.01); *G11C 29/44* (2013.01)

(58) Field of Classification Search
CPC .......... G11C 29/42; G11C 29/20; G11C 29/24
See application file for complete search history.

(56) References Cited

U.S. PATENT DOCUMENTS

| 4,939,694 | A | 7/1990 | Eaton et al. |
| 6,937,531 | B2 | 8/2005 | Frankowsky |
| 11,380,415 | B2 | 7/2022 | Noguchi et al. |
| 2003/0005353 | A1* | 1/2003 | Mullins .................. G11C 29/44 714/723 |

(Continued)

FOREIGN PATENT DOCUMENTS

| CN | 110196783 A | 9/2019 |
| CN | 110390993 A | 10/2019 |

(Continued)

OTHER PUBLICATIONS

Chinese Office Action for Application No. 202110205516.X dated Dec. 18, 2023.

*Primary Examiner* — Mohammed A Bashar
(74) *Attorney, Agent, or Firm* — Merchant & Gould P.C.

(57) ABSTRACT

A memory device includes: a memory cell array comprising a plurality of memory cells, the plurality of memory cells comprising a plurality of data memory cells including a first data memory cell and a plurality of backup memory cells including a first backup memory cell; a storage storing an error table configured to record errors in the plurality of data memory cells, the error table including a plurality of error table entries, each error table entry corresponding to one of the plurality of data memory cell and having an address and a failure count; and a controller configured to replace the first data memory cell with the first backup memory cell based on the error table.

20 Claims, 14 Drawing Sheets

(56) References Cited

U.S. PATENT DOCUMENTS

| | | |
|---|---|---|
| 2003/0172325 A1 | 9/2003 | Wyatt et al. |
| 2008/0195888 A1 | 8/2008 | Shuma |
| 2014/0146624 A1 | 5/2014 | Son et al. |
| 2016/0155515 A1 | 6/2016 | Son et al. |
| 2018/0158535 A1 | 6/2018 | Kim et al. |
| 2020/0241984 A1* | 7/2020 | Shim ............... G06F 11/073 |
| 2021/0313000 A1* | 10/2021 | Shan ............... G11C 29/883 |
| 2022/0336037 A1* | 10/2022 | Noguchi ........ G06F 11/1666 |

FOREIGN PATENT DOCUMENTS

| | | |
|---|---|---|
| JP | 2010-79774 A | 4/2010 |
| JP | 2011-203771 A | 10/2011 |
| KR | 10-2013-0135621 A | 12/2013 |
| KR | 10-1373668 B1 | 3/2014 |
| KR | 10-1545716 B1 | 8/2015 |

\* cited by examiner

| Address | Failure Count |
|---|---|
| A1 | N1 |
| A2 | N2 |
| A3 | N3 |
| A4 | N4 |
| A5 | N5 |
| A6 | N6 |
| A7 | N7 |
| A8 | N8 |
| A9 | N9 |
| A10 | N10 |
| A11 | N11 |

FIG. 2

|  | 602 | 604 | 142a |
| --- | --- | --- | --- |
|  | Address | Failure Count | |
| 606-1 | A6 | N6 | |
| 606-2 | A1 | N1 | |
| 606-3 | A11 | N11 | |
| 606-4 | A7 | N7 | |
| 606-5 | A9 | N9 | |
| 606-6 | A3 | N3 | |
| 606-7 | A10 | N10 | |
| 606-8 |  |  | |

M 606 (in this example, M=8)

FIG. 6A

| Address | Failure Count |
|---------|---------------|
| A6 | N6 |
| A1 | N1 |
| A11 | N11 |
| A7 | N7 |
| A9 | N9 |
| A3 | N3 |
| A10 | N10 |
| A4 | N4 |

606-1, 606-2, 606-3, 606-4, 606-5, 606-6, 606-7, 606-8

M 606 (in this example, M=8)

| Address | Failure Count |
|---------|---------------|
| A6 | N6 |
| A1 | N1 |
| A11 | N11 |
| A7 | N7 |
| A9 | N9 |
| A3 | N3 |
| A2 | N2 |
| A5 | N5 |

FIG. 6C

DYNAMIC ERROR MONITOR AND REPAIR

PRIORITY CLAIM AND CROSS-REFERENCE

This application is a continuation of U.S. patent application Ser. No. 17/130,250 filed Dec. 22, 2020, which claims priority to U.S. Provisional Application No. 62/982,369, filed Feb. 27, 2020, the disclosures of which are hereby incorporated by reference in their entirety.

BACKGROUND

Memory devices are used to store information in semiconductor devices and systems. A nonvolatile memory device is capable of retaining data even after power is cut off. Examples of nonvolatile memory devices include flash memory, ferroelectric random access memories (FRAMs), magnetic random access memories (MRAMs), resistive random access memories (RRAMs), and phase-change memories (PCMs). MRAM, RRAM, FRAM, and PCM are sometimes referred to as emerging memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 2. is an example error table in accordance with some embodiments.

FIG. 6A is a repair table in accordance with some embodiments.

FIG. 6B is another repair table in accordance with some embodiments.

FIG. 6C is yet another repair table in accordance with some embodiments.

DETAILED DESCRIPTION

Figure 1:
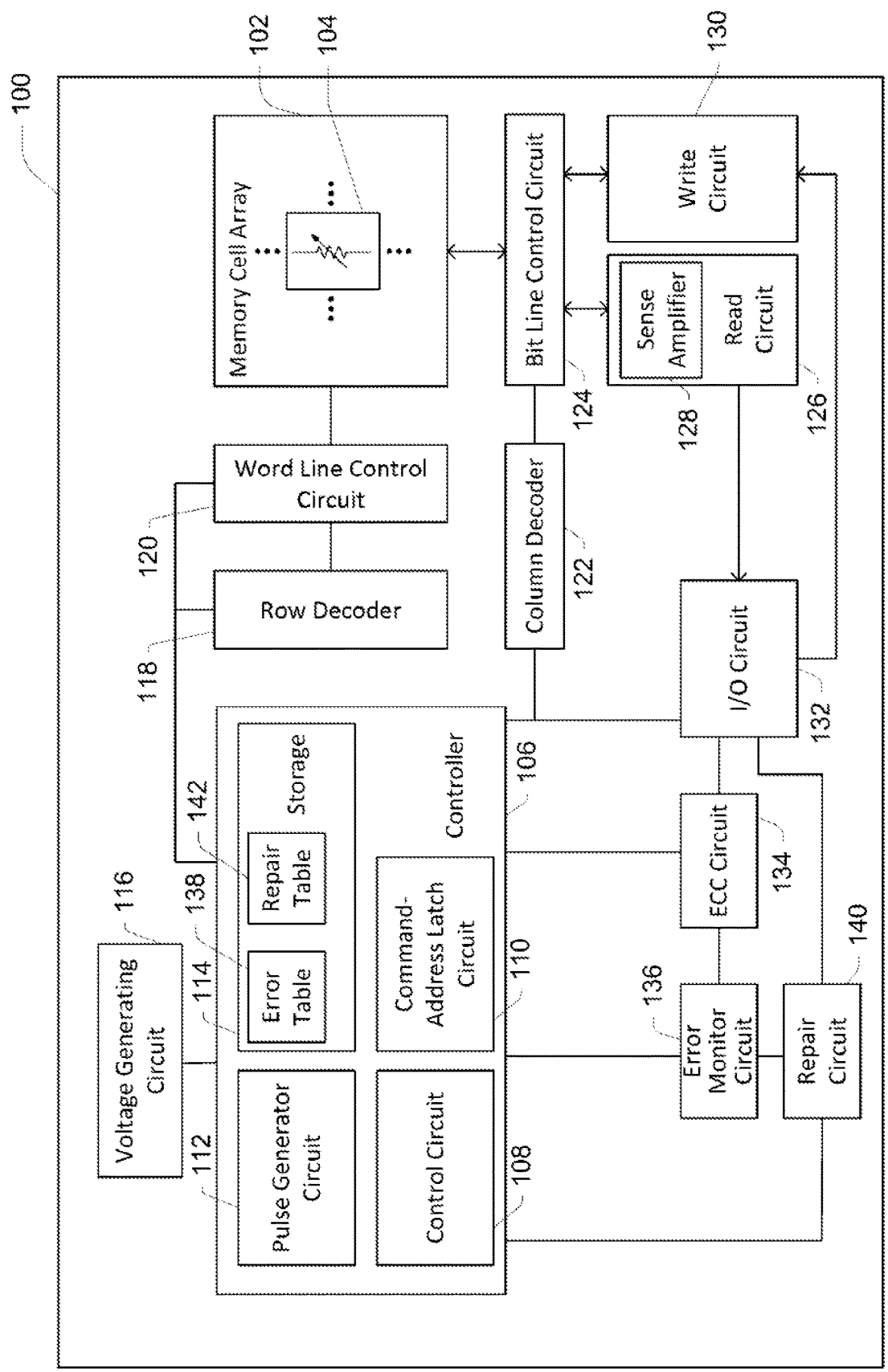
FIG. 1 is a block diagram illustrating an example memory device incorporating dynamic error monitor and repair in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fabrication processes for emerging memory devices such as ferroelectric random access memories (FRAMs), magnetic random access memories (MRAMs), resistive random access memories (RRAMs), and phase-change memories (PCMs) are still not mature. Due to the differences in fabrication processes, characteristics and usage conditions among memory cells, and so on, endurances and reliabilities of memory cells may be different. As such, "healthy" cells that are able to satisfactorily store data may fail over time, recording incorrectly storing data. In other words, those "healthy" cells become "failure" cells, and the data bits stored in those "failure" cells become "failure" bits. To address such memory failures, error correction code (ECC) is sometimes used to detect and correct data errors. Different ECC schemes may be utilized. Specifically, an ECC circuit can detect errors and correct them during the operation of the memory device. The ECC circuit may include, among other things, an ECC encoder and an ECC decoder. The ECC encoder is configured to generate parity bits and form a codeword, while the ECC decoder is configured to decode the codeword and provide corrected data.

As the complexity of data stored in memory devices increases, the error correction code (ECC) capabilities also increase. For instance, some ECC functions are able to correct multiple data bits. For example, an ECC with a five-bit capacity is capable of correcting errors of up to five bits. However, as complexity of data continues to increase, it may be difficult for ECC to provide the required data error corrections.

In accordance with some aspects of the present disclosure, an error table is generated and updated. The error table records both memory addresses and failure counts of failure cells corresponding to failure bits. Having an updated error table facilitates a better understanding of the status of the memory cells of the memory cell array, which in turn can be used for dynamic error monitor and repair. In a repair process, a portion of the data memory cells that are failure cells are replaced with backup memory cells based on the error table. As failure cells are replaced, corresponding failure bits are repaired. In one embodiment, data memory cells that have failure counts higher than a threshold failure count are replaced with the backup memory cells. In another embodiment, M data memory cells that have the highest M failure counts are replaced with the backup memory cells, and M is the number of the backup memory cells. As such, data memory cells with higher failure counts are replaced before data memory cells with lower failure counts are replaced. In yet another embodiment, a repair table records replaced memory cells with their addresses and failure counts. The repair table is updated in a periodically or once the error table is updated. Due to the limited number of backup memory cells, the repair table may be "full" (i.e., all backup memory cells have been used) after the memory device works for a certain period of time. Therefore, the repair table is updated to substitute any new entry with a higher failure count for any existing entry in the repair table with a lower failure count. As such, the repair table always keeps a record of entries with the highest failure counts, subject to its capacity. When the repair table has any change after an update, the replaced memory cell corresponding to the address being removed from the repair table is restored (i.e., becoming a data memory cell again), thus releasing one backup memory cell. The data memory cell corresponding to the address being added to the repair table is replaced by the released backup memory cell. Thus, in accordance with the embodiments above, a dynamic monitor and repair is implemented based on the error table and/or the repair table, and the limited backup memory cells are used efficiently and adjusted dynamically.

FIG. 1 is a block diagram illustrating an example memory device 100 incorporating dynamic error monitor and repair in accordance with some embodiments. In the example shown, the example memory device 100 includes, among other things, a memory cell array 102, a controller 106, a voltage generating circuit 116, a row decoder 118, a word line control circuit 120, a column decoder 122, a bit line control circuit 124, a read circuit 126, a write circuit 130, an input/output (I/O) circuit 132, an ECC circuit 134, an error monitor circuit 136, and a repair circuit 140.

The memory cell array 102 includes multiple memory cells 104 arranged in rows and columns. The memory cells 104 may include MRAM cells, RRAM cells, FRAM cells, and/or PCM cells, though other types of memory cells may also be employed. For simplicity, each memory cell 104 stores one bit of data, though other arrangements (e.g., two memory cells 104 store one bit of data) are also within the scope of the disclosure. In other words, one bit cell (i.e., the unit to store one bit of data) includes one memory cell 104.

The controller 106 includes, among other things, a control circuit 108, a command-address latch circuit 110, a pulse generator circuit 112, and a storage 114. The command-address latch circuit 110 temporarily holds commands and addresses received by the memory device 100 as inputs. The command-address latch circuit 110 transmits the commands to the control circuit 108. The command-address latch circuit 110 transmits the addresses to the row decoder 118 and the column decoder 122.

The row decoder 118 decodes a row address included in the address and sends the row address to the word line control circuit 120. The word line control circuit 120 selects a word line (corresponding to a specific row) of the memory cell array 102 based on the decoded row address. Specifically, the memory cells 104 in that specific row are accessed.

On the other hand, the column decoder 120 decodes a column address included in the address and sends the column address to the bit line control circuit 124. The bit line control circuit 124 selects a bit line (corresponding to a specific column) of the memory cell array 102 based on the decoded column address. Specifically, the memory cell 104 in that specific column, among all the memory cells 104 in that specific row, is accessed and data can be written to or read from the memory cell 104 in that specific row and specific column.

During a write operation, the write circuit 130 supplies various voltages and currents for data writing to the memory cell 104 selected based on the decoded row address and the decoded column address. The write pulses needed (i.e., the write pulse width) for the write operation is generated by the pulse generator circuit 112. In the illustrated example of FIG. 1, the pulse generator circuit 112 is located in the controller 106, though the pulse generator circuit 112 may be a separate component outside the controller 106. The write circuit 130 includes, among other things, a write driver not shown.

During a read operation, the read circuit 126 supplies various voltages and currents for data reading from the memory cell 104 selected based on the decoded row address and the decoded column address. The read circuit 126 includes, among other things, a read driver not shown and a sense amplifier 128. The sense amplifier 128 senses a relatively small difference between the voltages of two complementary bit lines (i.e., BL and BLB) and amplifies the difference at the output of the sense amplifier 128.

The I/O circuit 132 is coupled to both the write circuit 130 and the read circuit 126. During the write operation, the I/O circuit 132 temporarily holds data to be written and transmits the data to be written to the write circuit 130. On the other hand, during the read operation, the I/O temporarily holds data read by the read circuit 126.

The voltage generation circuit 116 generates various voltages used for the operation of the memory device 100 by using power supply voltages outside the memory device 100. The various voltages generated by the voltage generation circuit 116 may be applied to components of the memory device 100 such as the controller 106, the row decoder 118, the word line control circuit 120, the column decoder 122, the bit line control circuit 124, the read circuit 126, the write circuit 130, the I/O circuit 132, the ECC circuit 134, the error monitor circuit 136, and the repair circuit 140.

The control circuit 108 receives the commands from the command-address latch circuit 110. In response to the commands, the control circuit 108 controls operations of components of the memory device 100 such as the controller 110, the row decoder 118, the word line control circuit 120, the column decoder 122, the bit line control circuit 124, the read circuit 126, the write circuit 130, the I/O circuit 132, the pulse generator circuit 112, the storage 114, the command-address latch circuit 110, the voltage generating circuit 116, the ECC circuit 134, the error monitor circuit 136, and the repair circuit 140.

The ECC circuit 134 may employ various methods of ECC error detection and ECC error correction, though other methods may also be employed. ECC schemes are used to detect and correct bit errors stored in a memory device. The ECC circuit 134 may encode data by generating ECC check bits, e.g., redundancy bits or parity bits, which are stored along with the data in a memory device. Data bits and check (e.g., parity) bits together form a codeword. Many schemes have been developed to implement ECC, including Hamming codes, triple modular redundancy, and others. Hamming codes, for example, are a class of binary linear block codes that, depending on the number of parity bits utilized, can detect up to two bit errors per codeword, or correct one bit error without detection of uncorrected errors. Several schemes have been developed, but in general, if parity bits are arranged within a codeword such that different incorrect bits produce different error results, the bits in error can be identified. For a codeword with errors, the pattern of errors is called the (error) syndrome and identifies the bits in error. The Hamming codes can be decoded using a syndrome decoding method. In a syndrome decoding method, the syndrome is calculated by multiplying the received codeword with the transpose of a parity-check matrix. Specifically, the multiplication of any valid codeword with the transpose of the parity-check matrix is equal to zero, whereas the multiplication of any invalid codeword with the transpose of the parity-check matrix is not equal to zero. The parity-check matrix H of ECC is a matrix which describes the linear relations that the components of a codeword must satisfy. The parity-check matrix H can be used to decide whether a particular vector is a codeword. The parity-check matrix H can also be used in decoding algorithms. The calculation of the syndrome is carried out by a syndrome calculation circuit, which can be implemented as exclusive OR (XOR) trees. Each XOR tree has as inputs multiple data bits.

In one non-limiting example, an ECC that generates 8 parity bits for 64 bits of data can usually detect two bit errors and correct one bit error in the 64 bits of data, known as a DED/SEC code, meaning double-error detecting (DED) and single-error correcting (SEC). In another example, a DED/DEC scheme, meaning double-error detecting (DED) and double-error correcting (DEC), may be employed. In yet another example, a SED/SEC scheme, meaning single-error detecting (SED) and single-error correcting (SEC), may be employed. The ECC circuit 134 is configured to detect and correct errors occurred in failure cells during transmission or storage. The ECC circuit 134 may include, among other things, an error detection module not shown and an error correction module not shown.

The error monitor circuit 136 is coupled to the ECC circuit 134, the controller 106, and the repair circuit 140. The error monitor circuit 136 is configured to monitor the errors occurred in failure cells during transmission or storage. Based on the errors monitored by the error monitor circuit 136, the controller 106 may generate an error table 138 and/or a repair table 142 which are used for dynamic error monitor and repair. The error table 138 and the repair table 142 are described below in detail with reference to FIG. 2 and FIG. 6A-6C, respectively. The error table 138 and the repair table 142 are both stored in the storage 114. It should be noted that the error monitor circuit 136 may be a separate component as shown in the example in FIG. 1, it may also be incorporated into the ECC circuit 134 in other embodiments. In some embodiments, the error monitor circuit 136 may be incorporated into the controller 106. In other words, the controller 106 may implement all functions of the error monitor circuit 136.

The storage 114 stores, among other things, the error table 138 and the repair table 142. In another example, the storage 114 is a random-access memory (RAM). It should be noted that other types of storage may also be employed. It should be noted that the storage 114 may also be a separate component outside the controller 106.

The repair circuit 140 is coupled to the controller 106, the error monitor circuit 136, and the I/O circuit 132. The repair circuit 140 is configured to replace memory cells (i.e., failure cells) corresponding to failure bits with backup memory cells based on the error table 138 and/or the repair table 142, to prevent fatal errors from occurring. The operation of the repair circuit 140 is described below in detail with reference to FIG. 4, FIG. 5A, FIG. 5B, FIGS. 8A-8C, and FIG. 9.

Figure 3:
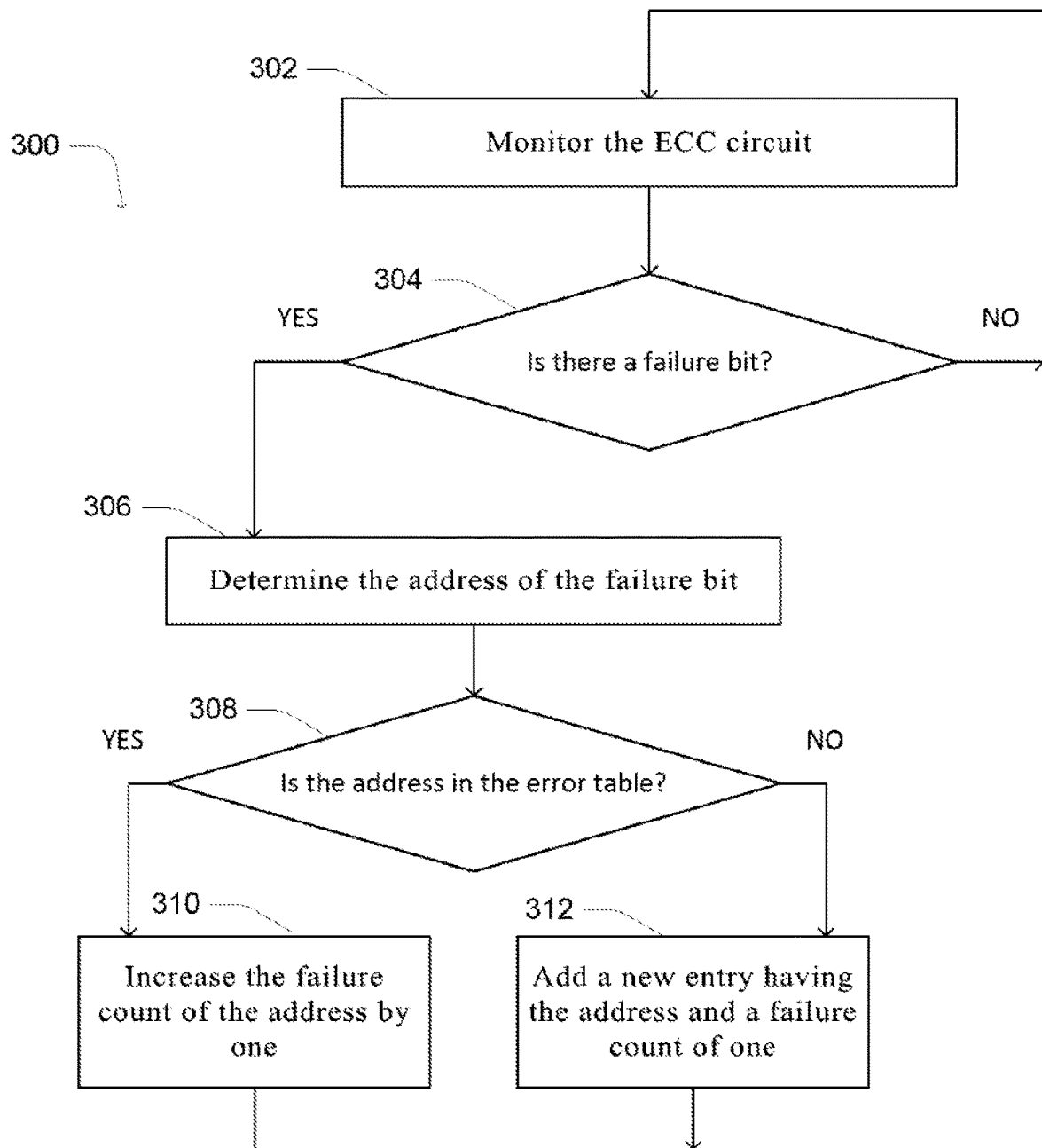
FIG. 3 is a flow chart illustrating a method of updating an error table in accordance with some embodiments.

FIG. 2 is an example error table 138 in accordance with some embodiments. FIG. 3 is a flowchart illustrating a method 300 of updating an error table in accordance with some embodiments. In general, an error table is a table that records both memory addresses of failure cells as described above and a count (i.e., a failure count) of data errors for each failure cell. Maintaining an error table in real time (i.e., recording memory addresses of failure cells and associated failure counts) facilitates a better understanding of the status of the memory cells of the memory cell array.

In the example shown in FIG. 2, the error table 138 includes two columns. The first column 202 includes addresses of failure cells, and the second column 204 includes failure counts of those failure cells. The illustrated error table 138 includes different entries 206, each of which corresponds to one failure cell. In the example error table 138, there are eleven entries 206-1 to 206-11 (collectively, 206), meaning that a total of eleven failure bits have been monitored so far. For example, the entry 206-5 corresponds to a failure bit (i.e., a failure cell) with an address A5, and the failure count is N5 (e.g., 2), meaning that the failure bit has failed twice.

It should be noted that the error table 138 is a dynamic table which is updated in a real-time manner, which will be described below with reference to FIG. 3. At the beginning (e.g., immediately after a factory reset) of the functioning of the memory device, the error table 138 may have very limited (e.g., only one) entries 206 or even be completely empty or void (i.e., no entry 206). After functioning for a while, the error table 138 may have more (e.g., eleven as shown in FIG. 2) entries 206, meaning the existence of more failure bits. In other words, errors accumulate over time.

Now referring to FIG. 3, the method 300 starts at step 302. At step 302, the ECC circuit 134 is monitored by the error monitor circuit 136. In one embodiment, the error monitor circuit 136 monitors the ECC circuit 134. For example, the syndrome generator of ECC circuit 134 may be specifically monitored. The method 300 then proceeds to step 304, wherein the error monitor circuit 136 determines whether there is a failure bit. In one embodiment, when the ECC circuit 134 detects an error, the associated data bit is labeled as a failure bit. As explained above, the ECC circuit 134 may detect an error by calculating the syndrome, and the calculation of the syndrome is carried out by a syndrome calculation circuit. As such, the error monitor circuit 136 may determine whether there is a failure bit. When the error monitor circuit 136 detects that the syndrome is equal to zero, the error monitor circuit 136 determines that there is no failure bit. When the error monitor circuit 136 detects that the syndrome is not equal to zero, the error monitor circuit 136 determines that there is a failure bit. It should be noted that although the ECC scheme used in the above example is based on Hamming codes, other error detection schemes (e.g., triple modular redundancy) are also within the scope of the disclosure.

When the error monitor circuit 136 determines that there is no failure bit at step 304, the method 300 loops back to step 302. As such, the error monitor circuit 136 keeps monitoring any failure bit in a real-time manner. On the other hand, when the error monitor circuit 136 determines that there is a failure bit at step 304, the method 300 proceeds to step 306. At step 306, the address of the failure bit is determined. In one embodiment, the address of the failure bit is determined by the ECC circuit 134 during the error correction process. For instance, the error-correction codes are Hamming or Hsiao codes that provide single-bit error correction and double-bit error detection (i.e., the DED/SEC scheme as mentioned above). Other schemes such as the DED/DEC scheme as mentioned above, the SED/SEC scheme as mentioned above, and the Reed-Solomon error correction codes can also be employed. In one embodiment, the error monitor circuit 136 gets access to the address of the failure bit from the ECC circuit 134. In one embodiment, the ECC circuit 134 passes along the address of the failure bit to the error monitor circuit 136.

Then the method 300 proceeds to step 308. At step 308, it is determined whether the address is in the error table 138. In one embodiment, the error monitor circuit 136 passes along the address of the failure bit to the controller 106, and the controller 106 in turn determines whether the address of the failure bit is in the error table 138 by checking the error table 138 stored in the storage 114.

When it is determined that the address of the failure bit (i.e., the failure cell) is in the error table (i.e., an existing failure bit in the error table), the method 300 proceeds to step 310. At step 310, the failure count of the failure bit is increased by one. For instance, when the address "A11" is in the error table 138, the failure count of the failure bit is increased by one (i.e., from "N11" to "N11 plus one"). On the other hand, when it is determined that the address of the failure bit is not in the error table (i.e., a new failure bit in the error table), the method 300 proceeds to step 312. At step 312, a new entry is added, and the new entry includes the address of the failure bit (i.e., the failure cell) and a failure count of one. For instance, when the address "A12" is not in the error table 138, a new entry is added to the error table 138. The new entry not shown includes the address "A12" and a failure count of 1.

After either step 310 or step 312, the method 300 loops back to step 302 where the error monitor circuit 136 monitors the ECC circuit 134. As such, the error monitor circuit 136 keeps monitoring any failure bit in a real-time manner and updates the error table 138 accordingly.

Figure 4:
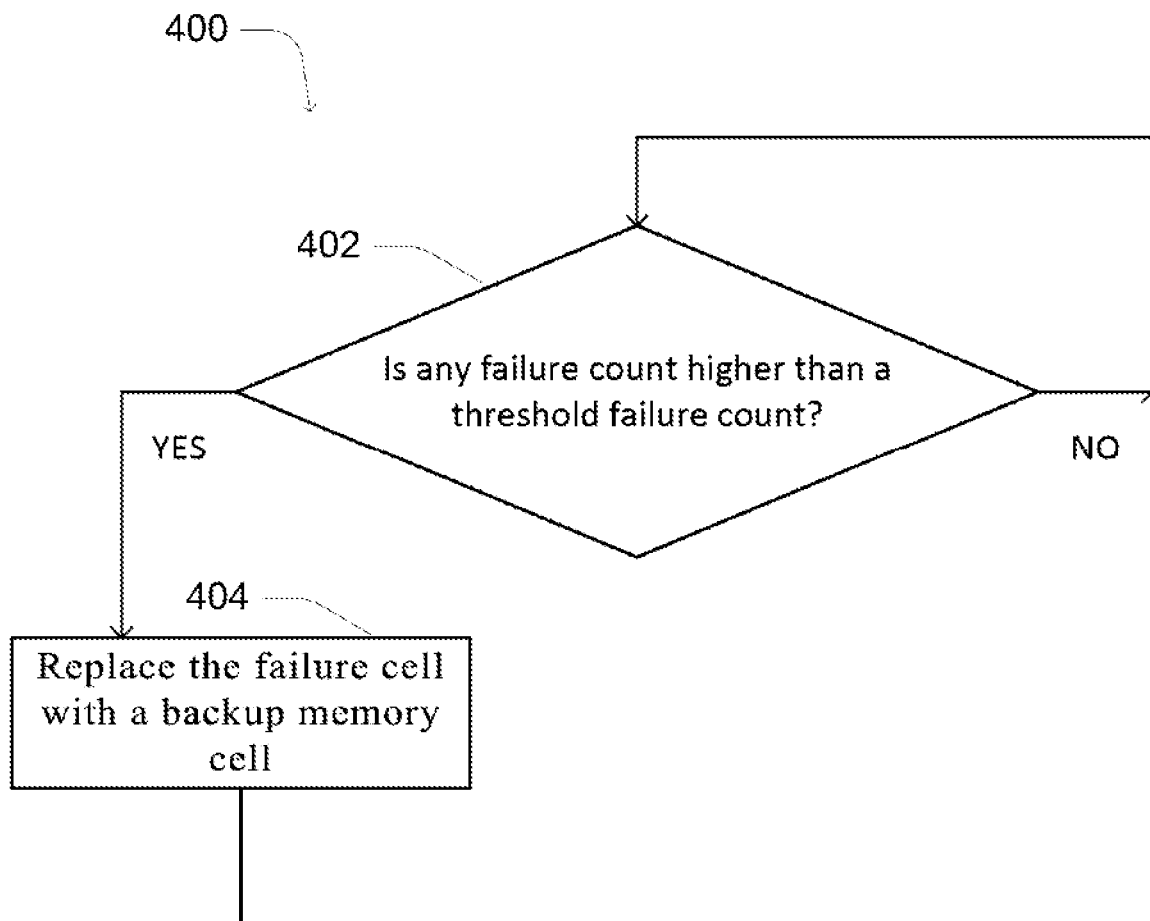
FIG. 4 is a flow chart illustrating a method of dynamic error monitor and repair in accordance with some embodiments.
Figure 5A:
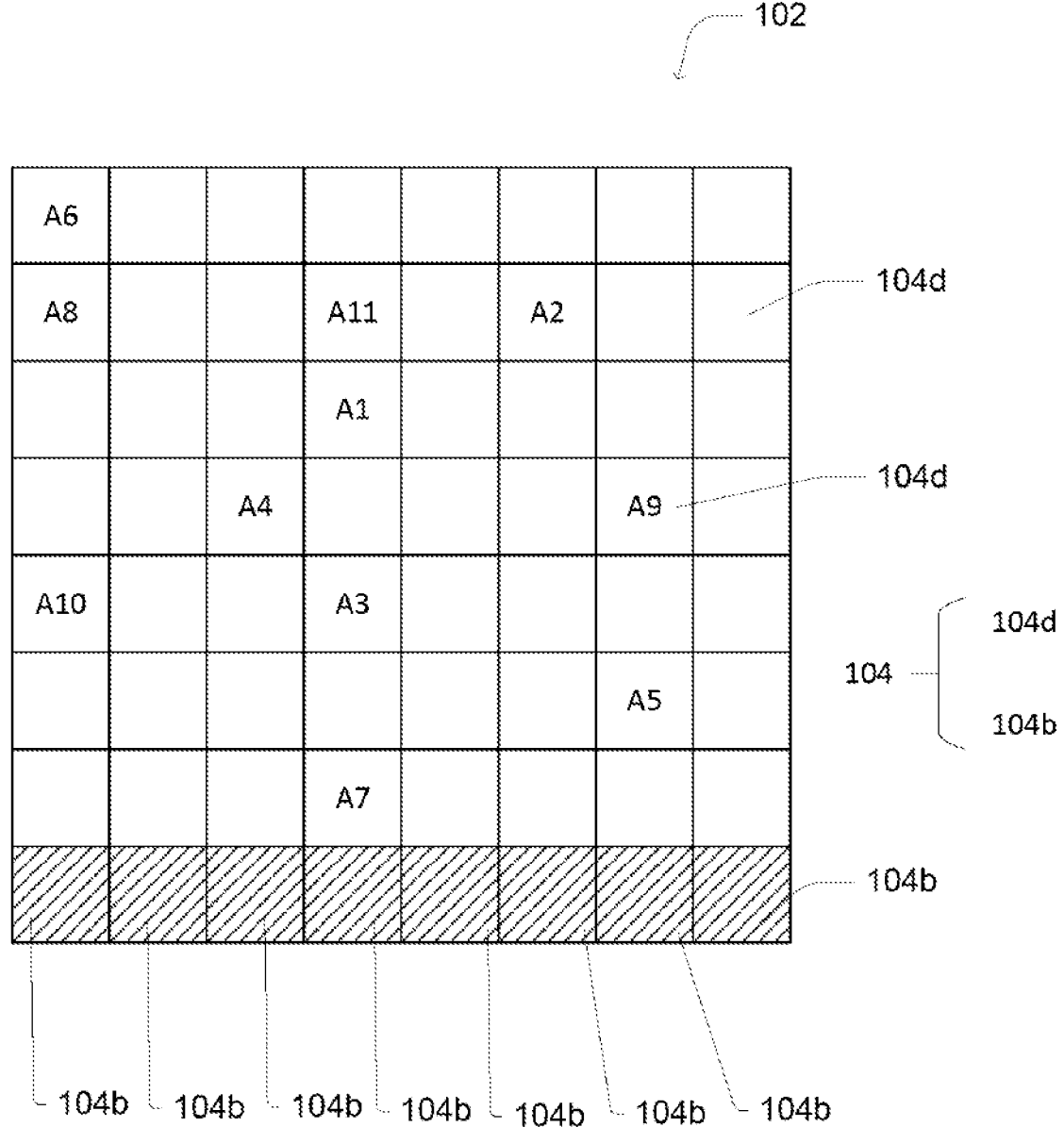
FIG. 5A is a schematic diagram illustrating a memory cell array with dynamic error monitor and repair before any replacement in accordance with some embodiments.
Figure 5B:
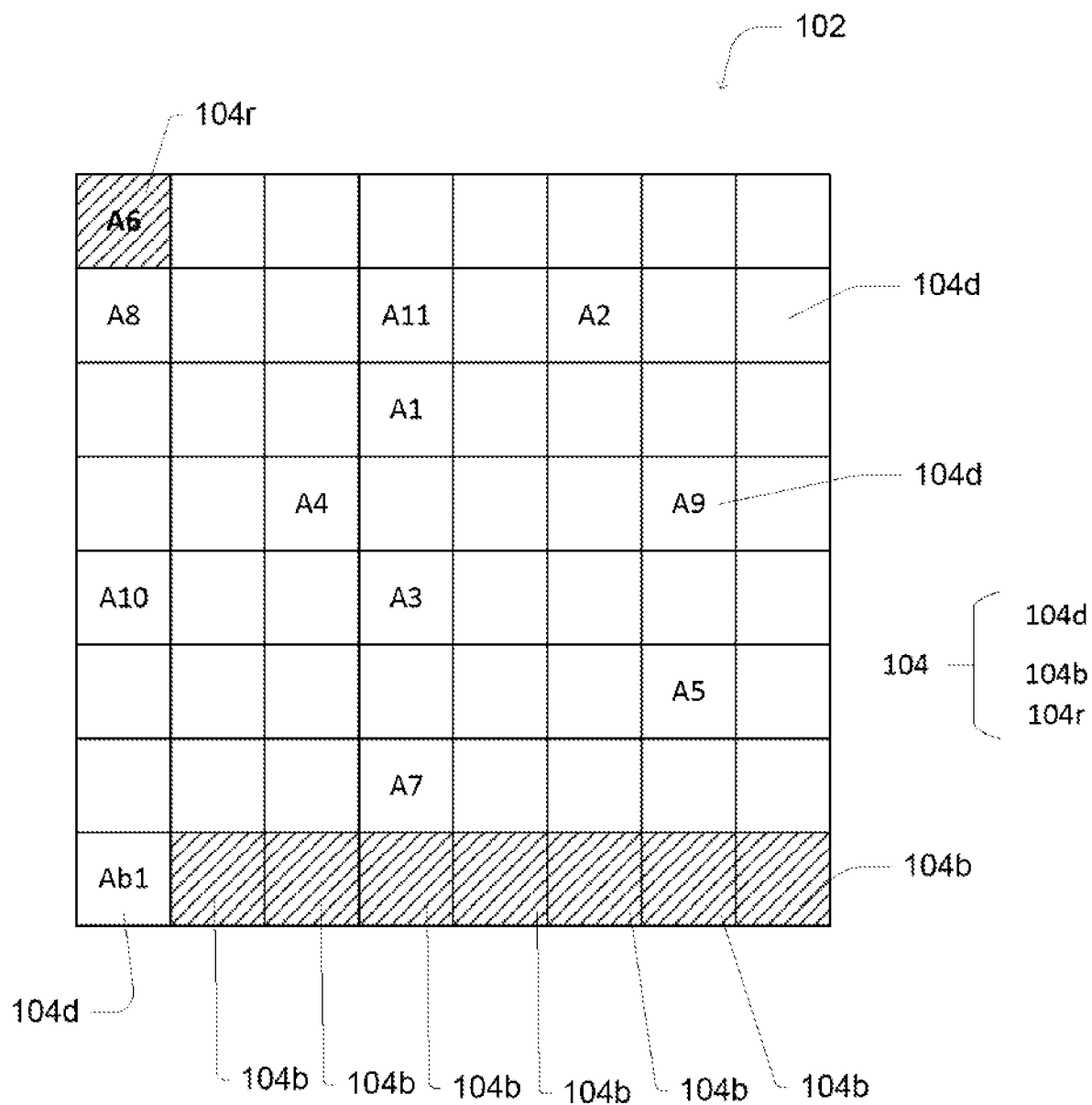
FIG. 5B is a schematic diagram illustrating the memory cell array of FIG. 5A after implementing the method of FIG. 4 in accordance with some embodiments.

FIG. 4 is a flow chart illustrating a method 400 of dynamic error monitor and repair in accordance with some embodiments. FIG. 5A is a schematic diagram illustrating a memory cell array 102 with dynamic error monitor and repair before any replacement in accordance with some embodiments. FIG. 5B is a schematic diagram illustrating the memory cell array 102 of FIG. 5A after implementing the method 400 of FIG. 4 in accordance with some embodiments. In general, the error table 138 is used for dynamic error monitor and repair. When the failure count of a certain failure bit is higher than a threshold failure number, the associated failure cell is replaced with a backup cell. In other words, the failure cell is no longer used for storing data—it is replaced by a backup memory cell.

The method 400 starts at step 402. At step 402, it is determined whether there is any failure count higher than the threshold failure count. In one embodiment, the controller 106 read all entries 206 of the error table 138, and compare all failure counts in the second column 204 of the error table 138 to the threshold failure number. In one non-limiting example, the threshold failure number is two. In another example, the threshold failure number is three. In yet another example, the threshold failure number is ten.

When there is no failure count higher than the threshold failure count, step 402 loops back to step 402. As such, the controller 106 keeps monitoring any failure count higher than the threshold failure count. On the other hand, when there is a failure count higher than the threshold failure count, the method 400 proceeds to step 404. At step 404, the failure cell corresponding to the failure count that is higher than the threshold failure count is replaced with a backup memory cell. The details of implementation of step 404 is described below with reference to FIG. 5A and FIG. 5B. The failure cell corresponding to the failure count that is higher than the threshold failure count is more likely to have a fatal failure than healthy cells and other failure cells with a failure count that does not exceed the threshold failure count, because higher failure counts indicate higher risks of irrevocable failures (i.e., fatal failures). Therefore, replacing failure cells having failure counts higher than the threshold failure count with backup memory cells can prevent fatal failures from happening, thus improving the reliability of the memory device 100.

Referring to FIG. 5A, the memory cell array 102 includes multiple memory cells 104 arranged in rows and columns. The memory cells 104 include two categories: data memory cells 104d and backup memory cells 104b. In the non-limiting example in FIG. 5A, there are eight backup memory cells 104b arranged in one row, though other numbers and arrangements are within the scope of the disclosure. The remaining memory cells 104 are data memory cells 104d used for storing data. Among those data memory cells 104d, some are healthy with no failure, and others have failed (i.e., failure cells with failure counts greater than zero). As shown in the example in FIG. 5A and FIG. 2, there are eleven data memory cells 104d (i.e., with the addresses A1 to A11) that have failed in the memory cell array 102. The addresses for these data memory cells 104d are recorded on the error table 138 shown in FIG. 2, along with corresponding failure count. Each of the eleven data memory cells 104d has its respective failure counts. In this example in FIG. 5A, none of the eleven failure counts exceeds the threshold failure count and accordingly, these cells are used for storing data. As a result, none of the backup memory cells has been used.

Referring to FIG. 5B, in this example, the memory cell 104 with the address A6 has a failure count (e.g., 4) that exceeds the threshold failure count (e.g., 3). As a result, the memory cell 104 with the address A6 is replaced by a backup memory cell 104b, thus becoming a replaced memory cell 104r not used for storing data, and one of the eight backup memory cells 104b (i.e., the memory cell with the address Ab1) is substituted for the memory cell 104 with the address A6. The data stored in the replaced cell 104r is transferred to the backup memory cell 104b. In one embodiment, the data transfer is implemented utilizing additional storage resources in the storage 114 as a temporary storage. After the substitution, the previous backup memory cell with the address of Ab1 becomes a data memory cell 104d, whereas the previous data memory cell 104d with the address A6 is not used for storing data. As such, the failure cell with the address A6 is replaced by a backup memory cell 104b, thus improving the reliability of the memory device 100. In one embodiment, the controller 106 may designate the replaced memory cell 104r as a "replaced memory cell," and designate the backup memory cell 104b used for replacement as "active." After the designation, other components (e.g., the control circuit 108 and the command-address latch circuit 110) of the memory device 100 can function accordingly in accordance with the replacement. In one embodiment, the controller 106 may instruct the repair circuit 140 to implement a portion or all of step 404.

Figure 7:
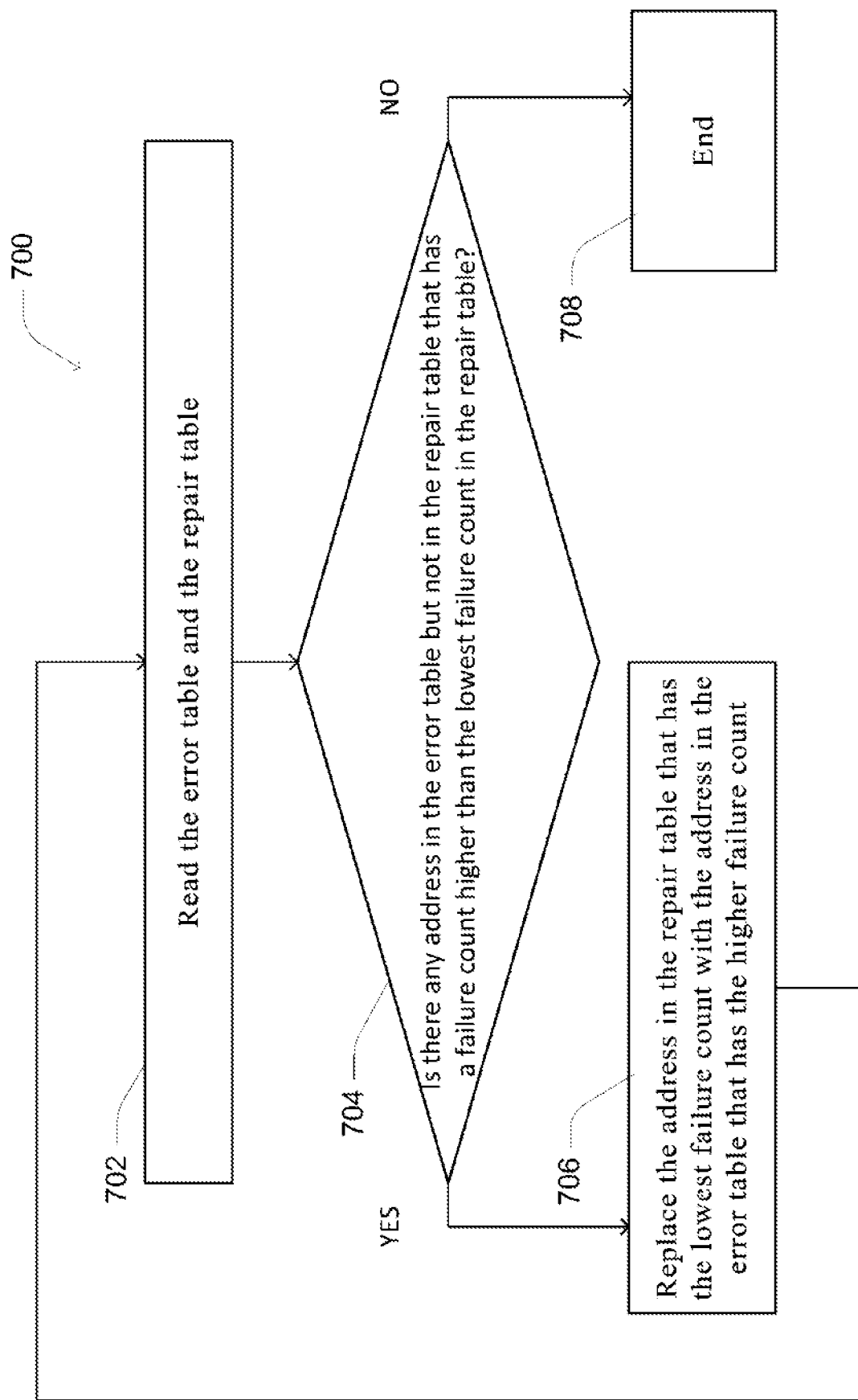
FIG. 7 is a flow chart illustrating a method of updating a repair table in accordance with some embodiments.

FIG. 6A is a repair table 142a in accordance with some embodiments. FIG. 6B is another repair table 142b in accordance with some embodiments. FIG. 6C is yet another repair table 142c in accordance with some embodiments. FIG. 7 is a flow chart illustrating a method 700 of updating a repair table in accordance with some embodiments. In general, a repair table records replaced memory cells 140r with their addresses and failure counts. The repair table may be updated periodically or once the error table is updated. Due to the limited number of backup memory cells 104b, the repair table may be "full" (i.e., all backup memory cells 104b have been used) after the memory device 100 works for a certain period of time. Therefore, the repair table may need to be updated to substitute any new entry with a higher failure count for any existing entry in the repair table with a lower failure count. As such, the repair table always keeps a record of entries with the highest failure counts, subject to its capacity (i.e., the number of backup memory cells 104b).

As shown in the example in FIG. 6A, the repair table 142a includes two columns. The first column 602 includes addresses of the replaced memory cells 104r, and the second column 204 includes failure counts of the replaced memory cells 104r. The repair table 142a includes different entries 606, each of which corresponds to one replaced memory cell 104r. The repair table 142a has a capacity of M entries 606, and M is the number of backup memory cells 104b. In the example shown in FIG. 5A, M is eight. In this example shown in FIG. 6A, the repair table 142a has seven entries 606-1 to 606-7 corresponding to seven replaced memory cells 104r, and the entry 606-8 is empty. In other words, the repair table 142a is not "full."

As shown in the example in FIG. 6B, the repair table 142a of FIG. 6A becomes the repair table 142b after the data memory cell 104d with the address A4 becomes a replaced memory cell 104r. The previous empty entry 606-8 now corresponds to the replaced memory cell 104r with the address of A4 and the failure count N4. The repair table 142b becomes full, meaning that all backup memory cells 104b have been used.

After the repair table 142 becomes full, the repair table 142 may be updated in accordance with the method 700 shown in FIG. 7. Referring to FIG. 7, the method 700 starts at step 702. At step 702, the error table 138 and the repair table 142 are read. In one embodiment, the controller 106 read both the error table 138 and repair table 142 which are stored in the storage 114. The method 700 then proceeds to step 704. At step 704, it is determined whether there is any address in the error table 138 but not in the repair table 142 that has a failure count higher than the lowest failure count in the repair table 142. In one embodiment, the controller 106 compares the entries 206 as shown in FIG. 2 to entries 606 as shown for example in FIG. 6B, to determine all addresses that are in the error table 138 but not in the repair table 142. The controller 106 then compares the corresponding failure counts to the lowest failure count in the repair table 142.

If it is determined that there is no address in the error table 138 but not in the repair table 142 that has a failure count higher than the lowest failure count in the repair table 142, the method 700 proceeds to step 708 where the method 700 ends. In other words, the repair table 142 does not need to be updated. On the other hand, if it is determined that there is one address in the error table 138 but not in the repair table 142 that has a failure count (e.g., five) higher than the lowest failure count (e.g., four) in the repair table 142, the method 700 proceeds to step 706.

At step 706, the address in the repair table 142 that has the lowest failure count is replace with the address in the error table 138 that has the higher failure count. For instance, the address A2 is determined to be in the error table 138 as shown in FIG. 2 but not in the repair table 142b as shown in FIG. 6B, and the failure count N2 (e.g., five) is higher than the lowest failure count (e.g., four) corresponding to the failure count N10 in the repair table 142b as shown in FIG. 6B. Then the address A10 in the repair table 142b is replaced with the address A2, as shown in FIG. 6C. The failure count N10 (e.g., four) is replace with the failure count N2 (e.g., five) as well. As such, one entry 606 in the repair table 142b has been updated, and the address (in this example, A10) with the lowest failure count (in this example, N10) is replaced with the address (in this example, A2) with the higher failure count (in this example, N2).

Then the step 706 loops back to step 702, the method 700 continues until finally ends at step 708. In other words, the method 700 continues and search all addresses in the error table 138 but not in the repair table 142 that has a failure count higher than the lowest failure count in the repair table. For instance, as shown in the example in FIG. 6C, after the address A10 is replaced with the address A2, the address A4 in the repair table 142b is replaced with the address A5 in the error table. The method 700 eventually ends at step 708. In the example shown in FIG. 6C, the repair table 142 after the update still have eight entries 606-1 to 606-8, but two entries 606-7 and 606-8 have been updated.

It should be noted that the method 700 as shown in FIG. 7 is a periodical update method. As a result, multiple (e.g., two) addresses in the repair table 142 might be replaced in one update. It should be noted that the update of the repair table may also be carried out in a real-time manner (i.e., once the error table 138 is updated, the method 700 is implemented) not shown in FIG. 7.

Figure 8A:
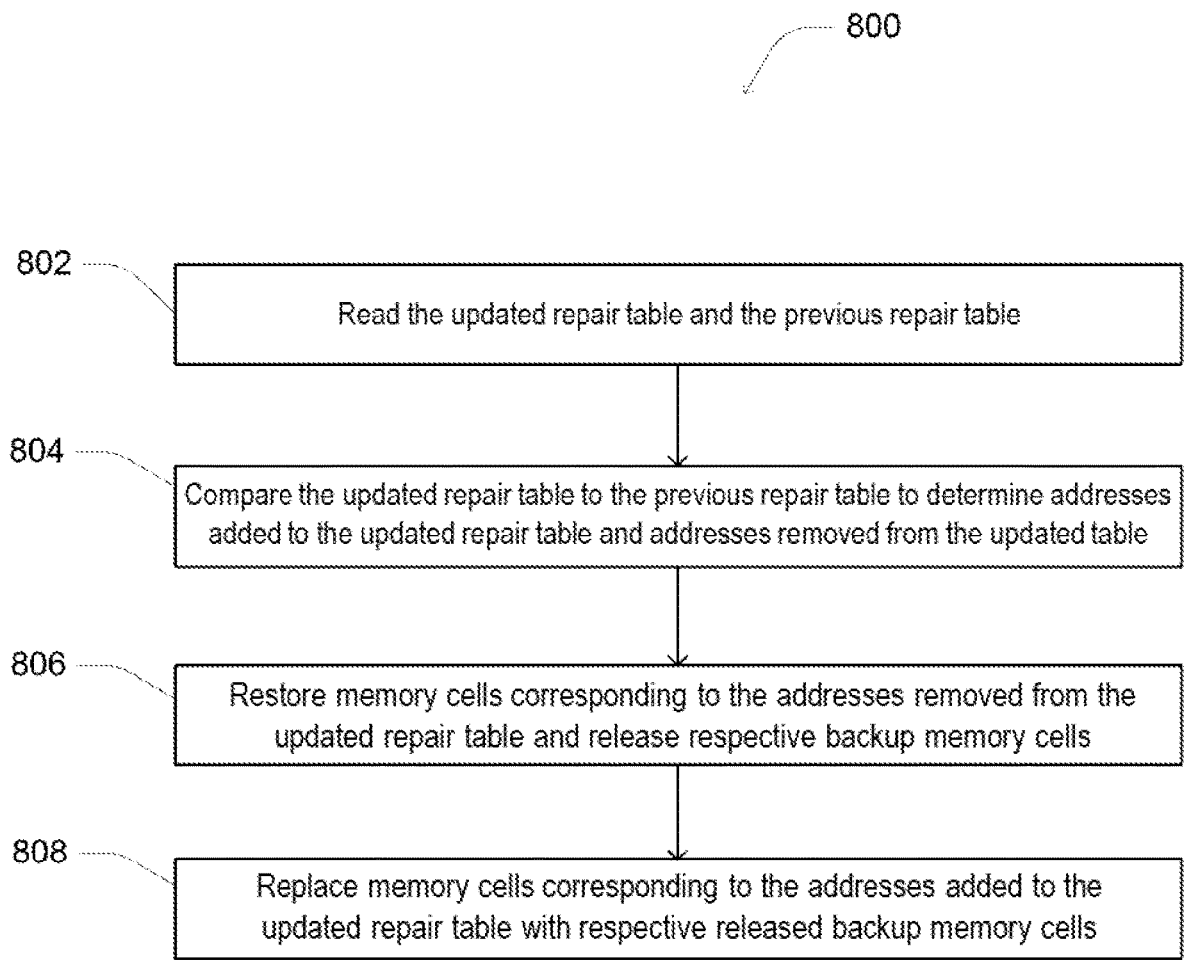
FIG. 8A is a flow chart illustrating a method of dynamic error monitor and repair in accordance with some embodiments.
Figure 8B:
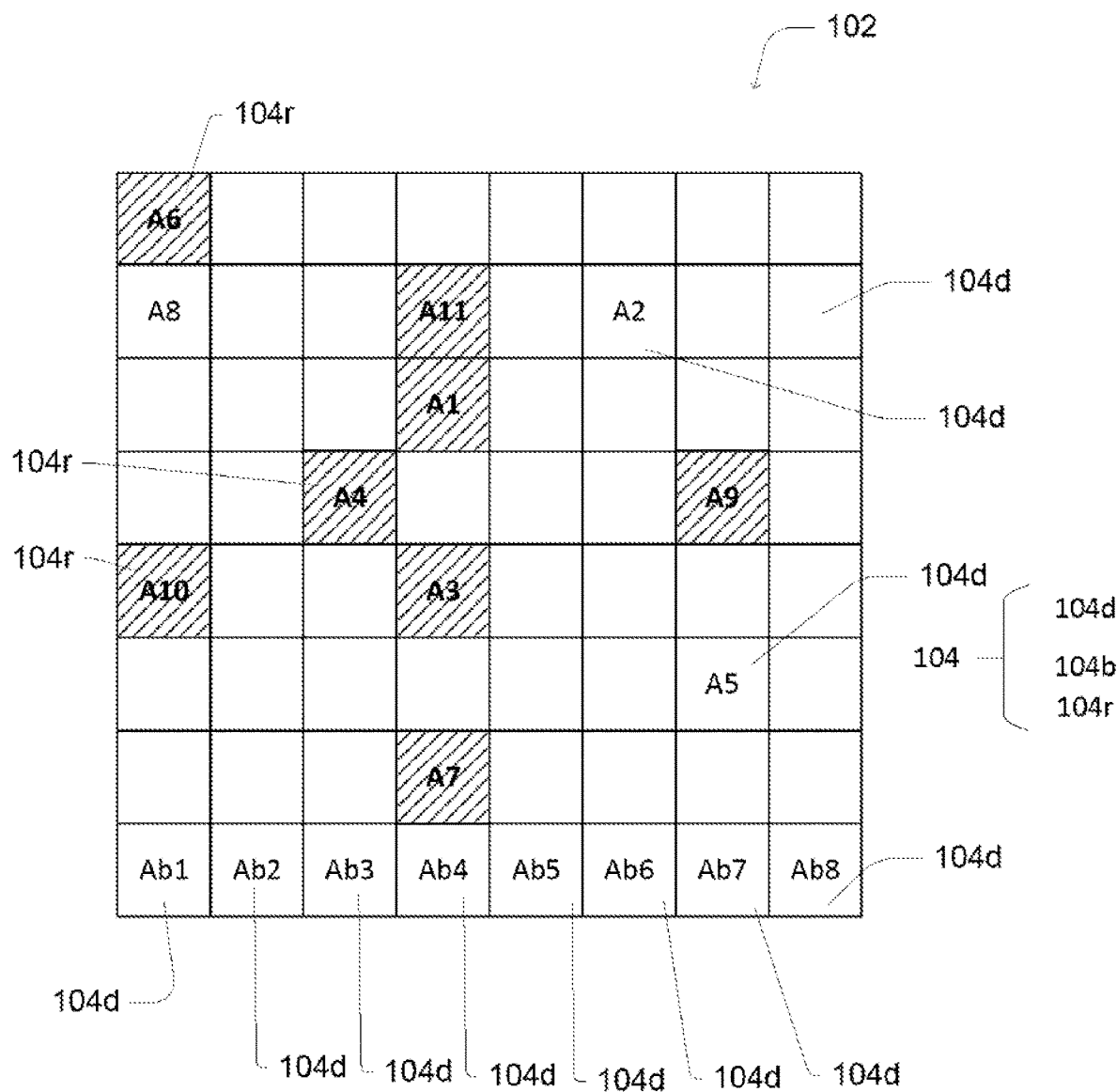
FIG. 8B is a schematic diagram illustrating a memory cell array before implementing the method of FIG. 8A in accordance with some embodiments.
Figure 8C:
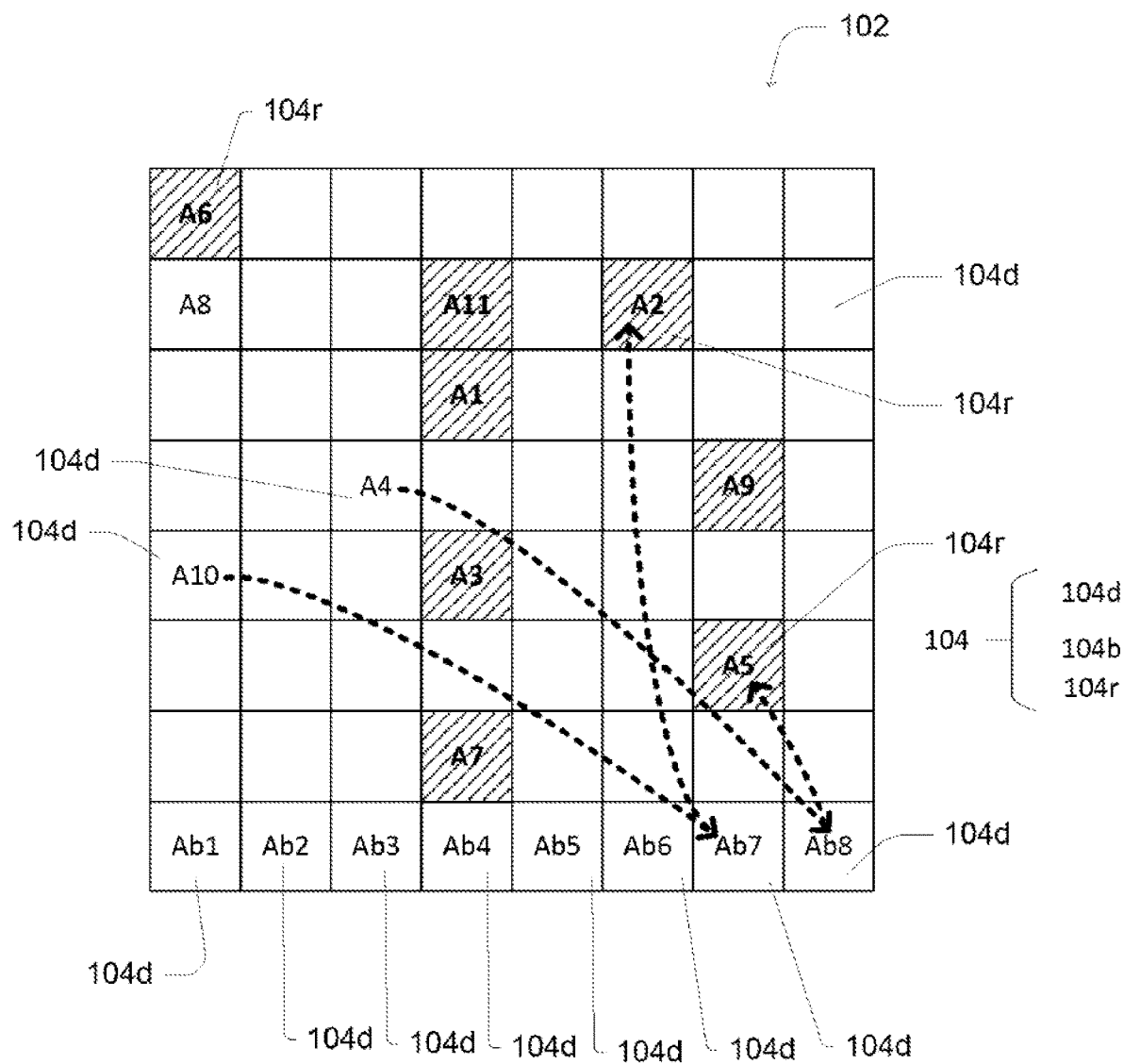
FIG. 8C is a schematic diagram illustrating the memory cell array of FIG. 8B after implementing the method of the FIG. 8A in accordance with some embodiments.

FIG. 8A is a flow chart illustrating a method 800 of dynamic error monitor and repair in accordance with some embodiments. FIG. 8B is a schematic diagram illustrating a memory cell array 102 before implementing the method 800 of FIG. 8A in accordance with some embodiments. FIG. 8C is a schematic diagram illustrating the memory cell array 102 of FIG. 8B after implementing the method 800 of the FIG. 8A in accordance with some embodiments. In general, the repair table 142 is used for dynamic error monitor and repair. When the repair table 142 has any change after an update, the replaced memory cell 104r corresponding to the address being removed from the repair table 142 is restored (i.e., becoming data memory cell 104d again), thus releasing one backup memory cell 104b. The data memory cell 104d corresponding to the address being added to the repair table 142 is replaced by the released backup memory cell 104b.

The method 800 starts at step 802. At step 802, the updated repair table and the previous repair table are read. In one example, the controller 106 reads both the updated repair table (e.g., the repair table 142c of FIG. 6C) and the previous repair table (e.g., the repair table 142b of FIG. 6B). The method 800 then proceeds to step 804. At step 804, the updated repair table is compared to the previous repair table to determine addresses added to the updated repair table and addresses removed from the updated table. In the example shown in FIG. 6B and FIG. 6C, addresses added to the updated repair table 142c are A2 and A5, whereas addresses removed from the updated repair table 142c are A10 and A4, respectively.

The method 800 then proceeds to step 806. At step 806, the replaced memory cells 104r corresponding to the addresses (in this example, A10 and A4 as shown in FIG. 8B) removed from the updated repair table 142c are restored, and respective backup memory cells (in this example, the backup memory cells 104d with addresses Ab7 and Ab8 as shown in FIG. 8B) are released. In other words, the replaced memory cells 104r corresponding to the addresses (in this example, A10 and A4 as shown in FIG. 8B) removed from the updated repair table 142c becomes data memory cell 104d again for data storage as shown in FIG. 8C, whereas the backup memory cells 104b (in this example, the backup memory cells 104b with addresses Ab7 and Ab8 as shown in FIG. 8B) are released to be backup memory cells 104b which can be used for replacing other data memory cells 104d later.

The method 800 then proceeds to step 808. At step 808, the data memory cells 104d corresponding to the addresses (in this example, A2 and A5 as shown in FIG. 8C) added to the updated repair table 142c are replaced with released backup memory cells 104b (in this example, the backup memory cells 104b with addresses Ab7 and Ab8 as shown in FIG. 8C). In other words, the data memory cells 104d corresponding to the addresses (in this example, A2 and A5 as shown in FIG. 8C) added to the updated repair table 142c become replaced memory cells 104r as shown in FIG. 8C, whereas the backup memory cells 104b (in this example, the backup memory cells 104b with addresses Ab7 and Ab8 as shown in FIG. 8B) become data memory cells 104d again. As such, after implementing the method 800, the memory cell array 102 of FIG. 8B becomes the memory cell array 102 of FIG. 8C. The memory cell with the address of A10 becomes a data memory cell 104d, and the memory cell with the address of A2 becomes a replaced memory cell 103r. Likewise, the memory cell with the address of A4 becomes a data memory cell 104d, and the memory cell with the address of A5 becomes a replaced memory cell 103r. Therefore, based on the updated repair table 142c of FIG. 6C which is updated to keep a record of entries with the highest failure counts, the dynamic error monitor and repair is carried out by implementing the method 800.

Figure 9:
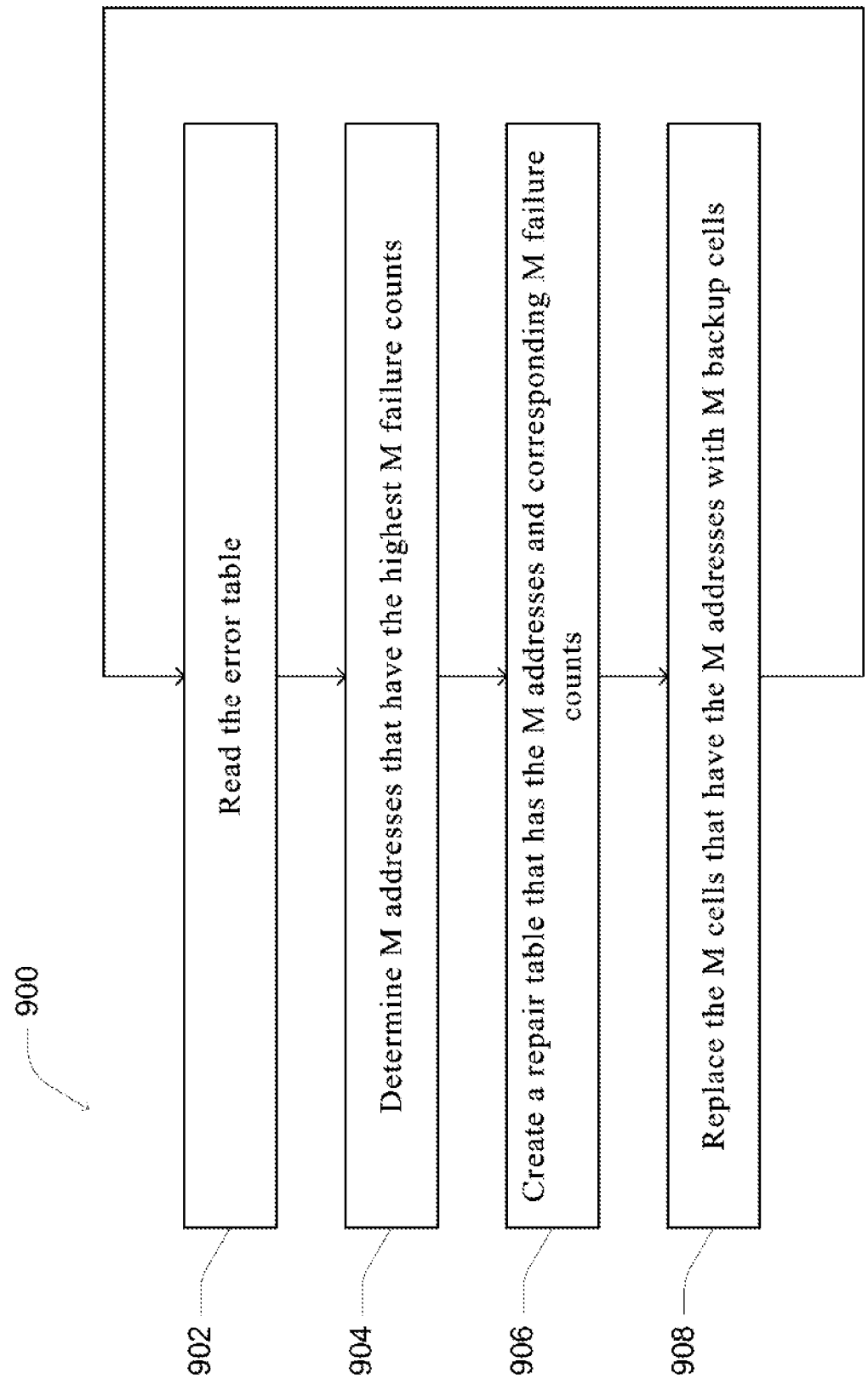
FIG. 9 is a flow chart of a method of dynamic error monitor and repair in accordance with some embodiments.

FIG. 9 is a flow chart of a method 900 of dynamic error monitor and repair in accordance with some embodiments. In general, a repair table is generated/updated periodically, and the repair table has M (i.e., the capacity of the repair table, and the number of backup memory cells) entries corresponding to M addresses with the highest M failure counts in the error table. Thus, the repair table always has M entries with the highest M failure counts after each update. Then the dynamic error monitor and repair is carried out based on the repair table. As such, backup memory cells are released periodically and being used to replace data memory cells having the highest M failure counts (i.e., the M data memory cells most likely to have fatal failures).

The method 900 starts at step 902. At step 902, the error table is read. In one embodiment, the controller 106 reads the error table 138 stored in the storage 114. The error table 138 may be the error table 138 of FIG. 2, which is updated in accordance with the method 300 of FIG. 3. The method 900 then proceeds to step 904. At step 904, M addresses that have the highest M failure counts are determined. In one embodiment, the controller 106 determines the M (e.g. eight) addresses that have the highest M (e.g. eight) failure counts in the error table 138 of FIG. 2. In one non-limiting example, the determination can be done by sorting the failure counts in the second column 204 of the error table 138 of FIG. 2.

The method 900 then proceeds to step 906. At step 906, a repair table that has the M addresses and corresponding M failure counts is created. In one embodiment, the controller 106 overwrites a previous repair table, if there is any, with the M (e.g., eight) addresses and the corresponding M (e.g., eight) failure counts determined at step 904. In another embodiment, the storage 114 may store multiple repair tables 142 and the controller generates a new repair table 142 at step 906. By storing multiple repair tables 142, a repair history is archived and can be traced back later for purposes such as diagnoses and decision making.

The method 900 then proceeds to step 908. At step 908, the M memory cells corresponding to the M addresses in the repair table generated at step 906 are replaced with the M backup memory cells. In one embodiment, the controller 106 and/or the repair circuit 140 may implement several steps similar to step 806 and step 808 of FIG. 8A. Specifically, the controller 106 and/or the repair circuit 140 may restore all replaced memory cells 104r and release all backup memory cells 104b (after the operation of restoration and release, the memory cell array looks like the memory cell array 102 of FIG. 5A). Then the controller 106 and/or the repair circuit 140 may replace the M (e.g., eight) memory cells 104d corresponding to the M (e.g., eight) addresses in the repair table 142 with the M (e.g., eight) released backup memory cells 104b (e.g., the eight backup memory cells 104b of FIG. 5A). As such, a repair table 142 is generated periodically based on the error table 138, and the dynamic error monitor and repair is carried out by implementing the method 900.

In accordance with some disclosed embodiments, a memory device is provided. The memory device includes: a memory cell array comprising a plurality of memory cells, the plurality of memory cells comprising a plurality of data memory cells including a first data memory cell and a plurality of backup memory cells including a first backup memory cell; a storage storing an error table configured to record errors in the plurality of data memory cells, the error table including a plurality of error table entries, each error table entry corresponding to one of the plurality of data memory cell and having an address and a failure count; and a controller configured to replace the first data memory cell with the first backup memory cell based on the error table.

In accordance with some disclosed embodiments, another memory device is provided. The memory device includes: a memory cell array comprising a plurality of memory cells, the plurality of memory cells comprising a plurality of data memory cells and M backup memory cells, M being an integer greater than one; a storage storing a repair table, wherein the repair table includes M repair table entries corresponding to M data memory cells replaced by the M backup memory cells, each repair table entry having an address and a failure count; and a controller configure to: update the repair table to generate an updated repair table; and replace at least one of the data memory cells with at least one of the backup memory cells based on the updated repair table.

In accordance with further disclosed embodiments, a method is provided. The method includes: providing a memory cell array comprising a plurality of memory cells, the plurality of memory cells comprising a plurality of data memory cells and a plurality of backup memory cells; detecting errors in the plurality of data memory cells by an ECC circuit; generating an error table, the error table including a plurality of error table entries, each error table entry corresponding to one of the plurality of data memory cell and having an address and a failure count; and replacing a first data memory cell among the data memory cells with a first backup memory cell among the backup memory cells, based on the error table.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an array of memory cells including data memory cells actively used for storing data and backup memory cells;
memory configured to store an error table that tracks errors of the data memory cells; and
a controller configured, in response to determining from the error table that a failure count of a first data memory cell is higher than a threshold failure count, to replace the first data memory cell with a backup memory cell and designate the backup memory cell as an activated data memory cell to be used for actively storing data, wherein the first data memory cell is designated, by the controller, as a deactivated data memory cell, and wherein responsive to a second failure count for a second data memory cell exceeding the failure count of the first data memory cell, the controller designates the deactivated data memory cell as a restored data memory cell.

2. The memory device of claim 1, wherein the controller designates the deactivated data memory cell as the restored data memory cell includes:
the memory is configured to store a repair table configured to record errors associated with one or more deactivated data memory cells, the repair table including a plurality of repair table entries, each repair table entry corresponding to one deactivated data memory cell and having an address and a failure count; and
the controller is configured, in response to determining that an error table entry has a higher failure count than a repair table entry, to:
designate the deactivated data memory cell associated with the repair table entry as the restored data memory cell belonging to the data memory cells actively used for storing data;
designate the second data memory cell associated with the error table entry as a second deactivated data memory cell belonging to the backup memory cells not actively used for storing data; and
update the repair table by replacing the repair table entry with the error table entry.

3. The memory device of claim 2, wherein the repair table has a number of entries corresponding to a number of the backup memory cells.

4. The memory device of claim 1, wherein the controller is configured to transfer data stored in the first data memory cell to the backup memory cell, and to designate the first data memory cell as a replaced memory cell.

5. The memory device of claim 1, wherein the controller is configured to transfer data stored in the first data memory cell to the backup memory cell, to designate the first data memory cell as a deactivated data memory not actively used for storing data, and to designate the backup memory cell as an activated data memory cell actively used for storing data.

6. The memory device of claim 1, further comprising:
a repair circuit configured to receive instructions from the controller and replace the first data memory cell with the backup memory cell according to the instructions.

7. The memory device of claim 1, wherein the error table includes a plurality of error table entries, each error table entry corresponding to one of the data memory cells and having an address and a failure count.

8. The memory device of claim 1, further comprising:
an error correction code (ECC) circuit configured to detect the errors in the data memory cells.

9. A memory device, comprising:
an array of memory cells including data memory cells actively used for storing data and backup memory cells;
memory configured to store a repair table that records a number of entries indicating which of the data memory cells which have been replaced by a backup memory cell that is designated as an activated data memory cell to be used for actively storing data; and
a controller configured, in response to detecting that a first data memory cell has a higher failure count than a lowest failure count of a replaced memory cell recorded in the repair table, to update an entry of the replaced memory cell in the repair table with information of the data memory cell, and in response to update the entry, transfer the replaced memory cell to a restored data memory cell.

10. The memory device of claim 9, wherein:
the memory is configured to store an error table, the error table is configured to record errors for the data memory cells, the error table including a plurality of error table entries, each error table entry corresponding to one of the data memory cells and having an address and a failure count; and
the controller is configured to update the repair table in response to determining that a repair table entry has a failure count lower than a failure count of an error table entry.

11. The memory device of claim 10, wherein:
the controller is configured to determine that the repair table entry has the failure count that is lower than the failure count of the error table entry by:
determining a first address, the first address being in the error table but not in the repair table, a first failure count corresponding to the first address being higher than the lowest failure count in the repair table, the lowest failure count corresponding to a second address; and
the controller is configured to update the repair table entry by:
replacing the second address and the lowest failure count with the first address and the first failure count, respectively.

12. The memory device of claim 10, wherein the repair table is updated periodically.

13. The memory device of claim 10, wherein the repair table is updated once the error table is updated.

14. The memory device of claim 9, wherein the memory cells are one of: a ferroelectric random access memory (FRAM) cell, a magnetic random access memory (MRAM) cell, a resistive random access memory (RRAM) cell, and a phase-change memory (PCM) cell.

15. A method, comprising:
   providing an array of memory cells including data memory cells actively used for storing data and backup memory cells;
   storing an error table that tracks errors of the data memory cells;
   in response to determining from the error table that a failure count of a first data memory cell is higher than a threshold failure count, replacing the first data memory cell with a backup memory cell and designate the backup memory cell as an activated data memory cell to be used for actively storing data, wherein the first data memory cell is designated as a deactivated data memory cell; and
   responsive to a second failure count for a second data memory cell exceeding the failure count of the first data memory cell, designating the deactivated data memory cell as a restored data memory cell.

16. The method of claim 15, wherein designating the deactivated data memory cell as the restored data memory cell includes:
   generating a repair table, the repair table including a plurality of repair table entries, each repair table entry corresponding to one deactivated data memory cell and having an address and a failure count;
   in response to determining that an error table entry has a higher failure count than a repair table entry:
   designating the deactivated data memory cell associated with the repair table entry as the restored data memory cell belonging to the data memory cells actively used for storing data;
   designating the second data memory cell associated with the error table entry as a second deactivated data memory cell not actively used for storing data; and
   updating the repair table by replacing the repair table entry with the error table entry.

17. The method of claim 16, wherein the repair table has a number of entries corresponding to a number of a plurality of backup memory cells.

18. The method of claim 15, wherein the replacing includes:
   transferring data stored in the first data memory cell to the backup memory cell; and
   designating the first data memory cell as a replaced memory cell.

19. The method of claim 15, wherein the replacing includes:
   transferring data stored in the first data memory cell to the backup memory cell;
   designating the first data memory cell as a deactivated data memory not actively used for storing data; and
   designating the backup memory cell as an activated data memory cell actively used for storing data.

20. The method of claim 15, wherein the error table includes a plurality of error table entries, each error table entry corresponding to one of the data memory cells and having an address and a failure count.

* * * * *